United States Patent [19]

Smith

[11] 4,417,327

[45] Nov. 22, 1983

[54] DYNAMICALLY OPERATED STRUCTURED LOGIC ARRAY

[76] Inventor: Kent F. Smith, 1775 Grover La., Salt Lake City, Utah 84117

[21] Appl. No.: 185,538

[22] Filed: Sep. 9, 1980

[51] Int. Cl.³ .............................................. G11C 13/00
[52] U.S. Cl. ..................................... 365/203; 365/230
[58] Field of Search ............... 365/203, 189, 230, 174, 365/175

[56] References Cited

U.S. PATENT DOCUMENTS 3,909,631  9/1975  Kitagawa ............................ 365/203

Primary Examiner—Terrell W. Fears
Attorney, Agent, or Firm—B. Deon Criddle; Terry M. Crellin

[57] ABSTRACT

A clocked structured logic array functions in a dynamic, rather than static, mode of operation. The column output conductors and row conductors of the array are precharged to a predetermined voltage level at the beginning of a clock cycle. At the termination of a first phase of the clock cycle, the column conductors are selectively discharged in accordance with information stored in column memory elements. Upon termination of a second phase of the clock cycle, the row conductors are selectively discharged in accordance with a predetermined program, and responsive to the states of the column output conductors. The states of the row conductors are selectively transmitted to the column input conductors, and during a third phase of the clock cycle the information related to the states of the input conductors is transmitted to the memory elements.

29 Claims, 12 Drawing Figures

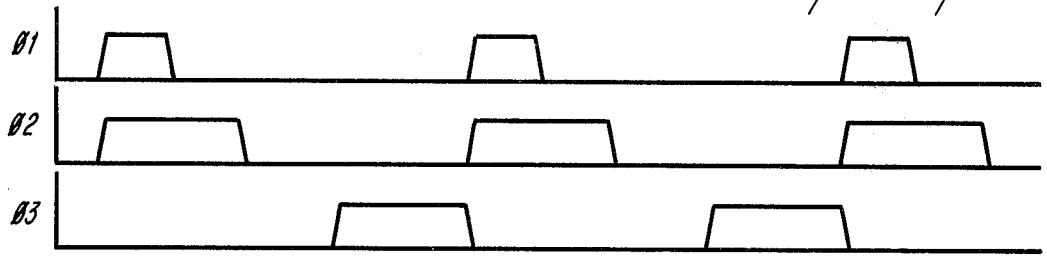
Fig. 6
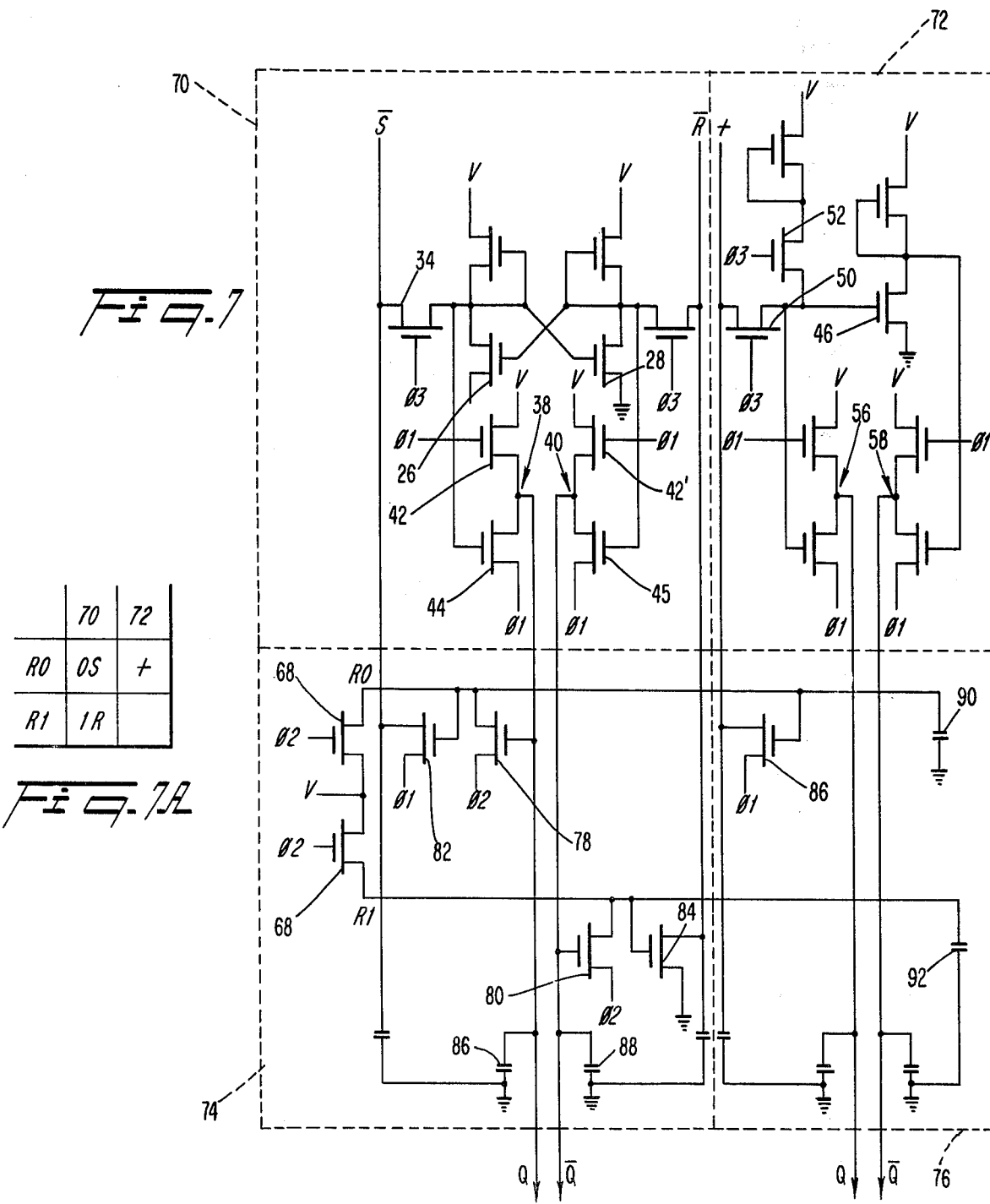
Fig. 7
Fig. 7A
| | 70 | 72 |
|---|---|---|
| R0 | 0S | + |
| R1 | 1R | |

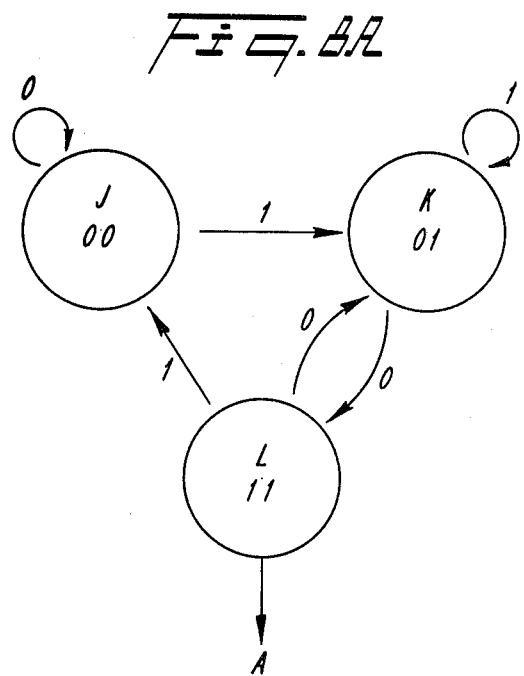
Fig. 8A
Fig. 8B
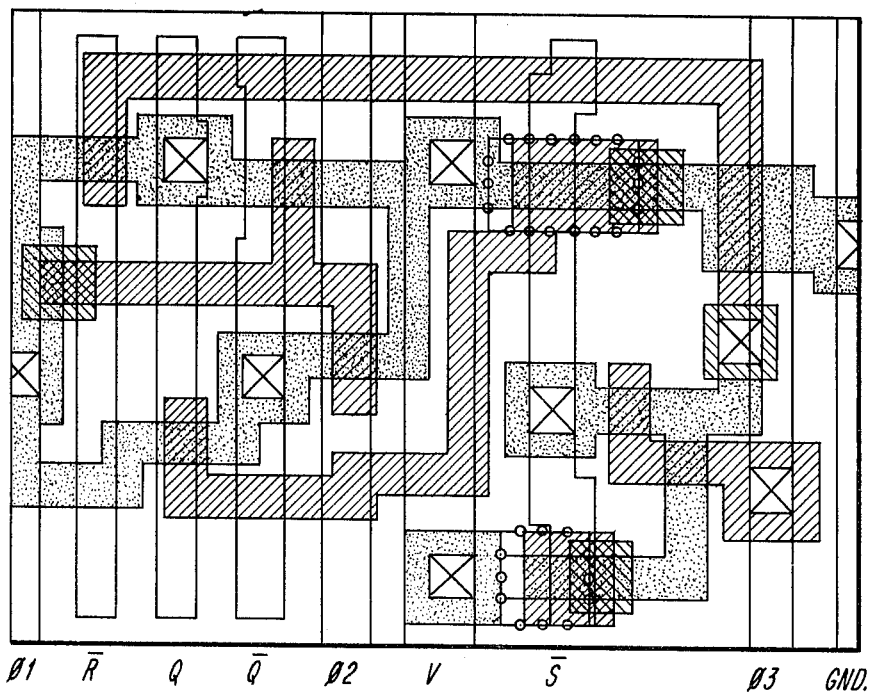
Fig. 9

DYNAMICALLY OPERATED STRUCTURED LOGIC ARRAY

BACKGROUND OF THE INVENTION

The present invention relates to digital logic circuits in the form of structured logic arrays, and more particularly, to structured logic arrays which can be implemented using MOS integrated circuit technology to dynamically execute the steps of a Boolean function.

The general design and operating principles of a structured logic array, also sometimes referred to as a storage or stored logic array, are disclosed in U.S. Pat. No. 4,068,214, issued to Suhas S. Patil, the disclosure of which is hereby incorporated by reference. The array basically comprises a plurality of orthogonally disposed column and row conductors. Each group of conductors comprising a column is associated with a Boolean variable, and the electrical potentials of the conductors represent the logical state of the variable. Each row in the array performs the function of a Boolean implicant, or a conjunction term. The rows and columns of the array are interconnected in accordance with one or more Boolean functions by means of cell networks. The cell networks connect column output conductors to a row by means of logical conjunctive (AND or NAND) connections, and connect the column input conductors to a row by means of logical disjunctive (OR or NOR) connections. By arranging the cell networks to interconnect the columns and rows in accordance with one or more predetermined Boolean functions, the structured logic array can produce predetermined output signals in response to a predetermined input signal or set of signals.

Such a structured logic array can be constructed in a programmable format. The cell networks can be connected to the conductors of the columns and rows by means of discretionary contacts which enable the cells to be selectively interconnected between the rows and columns of the array in accordance with one or more predetermined Boolean functions. In addition, the row and column conductors can have discretionary contacts periodically disposed along their lengths to enable the rows and columns to be segmented, to thereby enable a plurality of independent functions to be executed.

The previously cited patent application further discloses that each cell network can comprise a logic network, and at least some of the cells can also include a storage network. The columns connected to the cells having storage elements are thereby equipped with memory capabilities.

Structured logic arrays such as those disclosed in the previously mentioned patent and patent application have a number of advantages over prior art programmed logic arrays and other forms of digital memory circuits, such as ROM's, for example. The structured logic array can be segmented to perform a number of independent tasks, thereby providing an increased degree of versatility in program execution, and hence increased applicability over prior art circuits. The structured logic array does not require extra program steps to extract and combine non-uniform sized data fields, a drawback inherent to the prior art systems. In addition, the structured logic array is capable of executing a number of actions simultaneously, rather than sequentially.

A further advantage of the structured logic array lies in the increased perception it affords the initial circuit designer into the considerations involved in the physical layout of the circuit. In the design and construction of many logic circuits, the initial designer formulates a circuit, using logic elements, to perform a desired function. An engineer familiar with the mechanics of constructing circuits then prepares the physical layout for the designed circuit, utilizing actual electronic components which make up the logic elements. The initial designer is concerned with the functional aspects of the circuit while the layout engineer is interested in placing all of the necessary electronic components within a predetermined amount of space in an operative arrangement, and quite often each person is not aware of the other's concerns in the design of the circuit, which can result in less than optimum efficiency in circuit design. However, the structured logic array provides the initial designer with a perception of the circuit layout, thus affording a more efficient concept for circuit design.

In the past, logic arrays, including structured logic arrays, have been designed as static circuits which require a source of a continuous DC voltage signal for constantly supplying power to all of the components in the circuit. For example, the previously cited patent application discloses a specific circuit implementation of a structured logic array using $I^2L$ circuit technology. It will be readily appreciated that the need to continuously supply DC power to all of the components of the array is undesirable from an economic standpoint, particularly for large array circuits. In addition, the speed with which logic functions can be carried out in a static circuit is limited due to the presence of load devices which are inherent to static circuits and which limit the current available to perform switching operations. If the load devices in the circuit are made larger to reduce their resistance and thereby increase the current available to charge circuit capacitance, then the size of the switching transistors in the array for discharging, or pulling the capacitance to ground, must also be increased to enable them to carry the larger current. Larger transistors increase the capacitance in the circuit, and therefore the switching speed of the circuit remains limited due to the additional time necessary to charge and discharge the larger capacitance.

Furthermore, the speed with which logic functions can be performed in a static array is inversely proportional to the size of the array. As the number of columns and rows in the array are increased, the switching speed of the array as a whole decreases. Thus, for a logic array of any practical size, the available switching speed is limited to a degree which renders use of the array infeasible except in limited applications where slow switching speeds can be tolerated.

It is therefore a general object of the present invention to provide a novel structured logic array which overcomes the need to provide a continuous DC power signal throughout the rows and columns of the array.

It is another object of the present invention to provide a novel structured logic array which operates at least partially in a dynamic mode to thereby decrease power requirements.

It is a further object of the present invention to provide a novel method for dynamically executing a Boolean function.

It is yet another object of the present invention to provide a novel structure which enables the size of a logic array to be increased over static circuits without significantly affecting the speed with which operations can be carried out in the array.

It is yet a further object of the present invention to provide a novel structured logic array which achieves the foregoing objects through the use of integrated circuit technologies, and in its preferred embodiment MOS technology, to thereby utilize, in an advantageous manner, the high input impedance and stray capacitance inherent to such circuits.

BRIEF DESCRIPTION OF THE DRAWINGS

The manner in which these, as well as other objectives and advantages, are accomplished in accordance with the present invention will be appreciated upon a perusal of the following description of the preferred embodiments of the present invention in conjunction with the accompanying drawings in which:

FIG. 5 is a block diagram illustrating one manner in which the storage and logic networks can be arranged to form a structured logic array;

FIG. 6 is a timing diagram illustrating the timing pulses which can be applied to the clock input terminals of the structured logic array;

FIG. 7 is a schematic circuit diagram of a structured logic array designed to toggle a flip-flop, illustrating the operating principles of the present invention;

FIG. 7A is a truth table for operational disclosure;

FIGS. 8A and 8B are a state diagram and an implementation diagram, respectively, for the structured logic array illustrated in FIG. 8; and FIG. 9 is a plan view illustrating one embodiment of an inverter storage network incorporated in an MOS integrated circuit.

DETAILED DESCRIPTION

In order to elucidate the various object and advantages of the present invention, the same will be described with reference to the preferred embodiments thereof illustrated in the accompanying drawings. It will be appreciated, however, that the following description is intended to be illustrative and not limitative.

Figure 1:
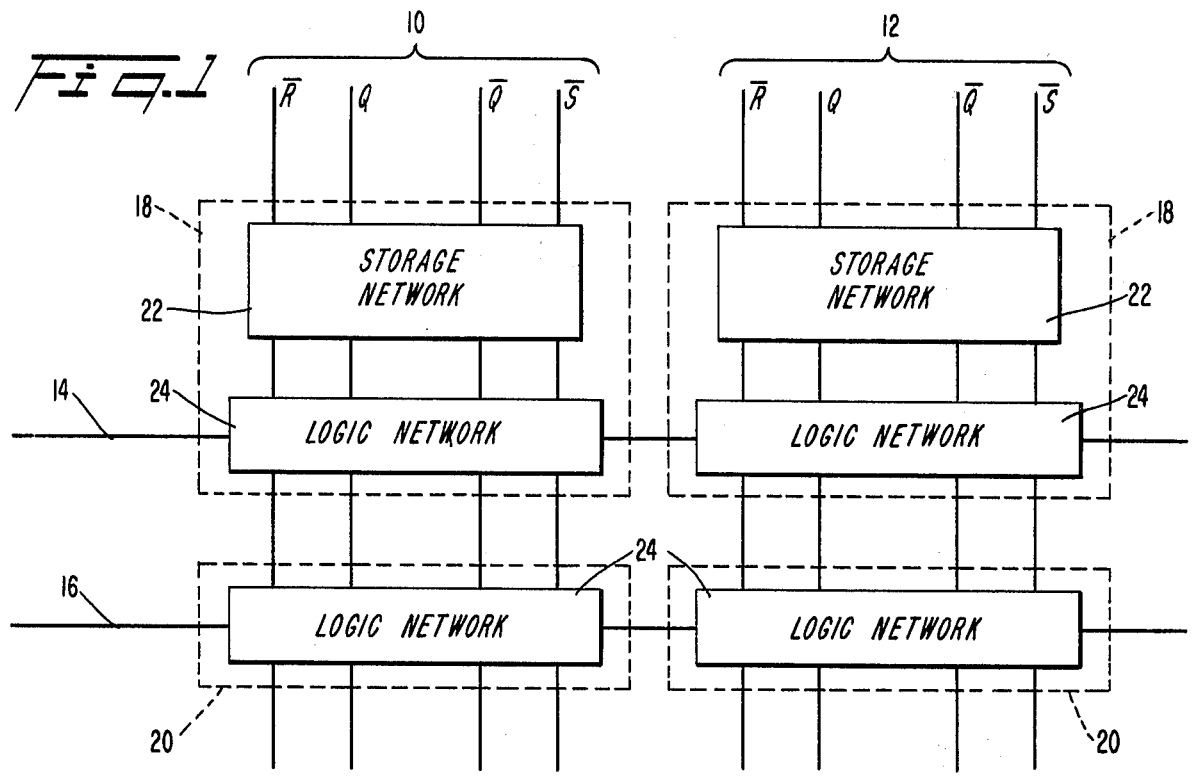
FIG. 1 is a block circuit diagram illustrating the basic elements of a structured logic array.

A structured logic array is illustrated in general in block diagram form in FIG. 1. The array includes a number of columns, only two of which 10, 12 are illustrated in FIG. 1. The total number of columns in the array can be equal to the number of variables in the program to be executed, such as internal states and input or output variables, with each column representing one of the variables. In the illustrated embodiment, each column 10, 12 comprises four conductors $\overline{R}$, Q, $\overline{Q}$, and S. The $\overline{R}$ and $\overline{S}$ conductors serve as input conductors for the column and the Q and $\overline{Q}$ conductors comprise complementary output conductors for the column. It will be appreciated that the number of conductors comprising a column can be other than four. For example, a column can be made of three conductors where only one input conductor and two complementary output conductors are to be utilized.

The array also includes a plurality of rows disposed orthogonally with respect to the columns. Each row comprises a single conductor, two of which 14, 16 are illustrated in FIG. 1.

To enable a predetermined program to be executed by the structured logic array, the columns 10, 12 and rows 14, 16 are logically interconnected, in accordance with the program, by means of cell networks 18, 20. A cell network 18 can include both a storage network 22 and a logic network 24. The storage network 22 stores the binary value of the variable represented by the column with which the network is associated. The logical interconnection between the rows and conductors, determined by the program to be executed, is performed by the logic network 24. Since it is only necessary to provide one storage network for each variable, only one cell 18 per column will generally include a storage network 22. The remaining cells in the column can comprise a logic network 24 only, as illustrated at 20 in FIG. 1. However, if a column is segmented, i.e., the column conductors are discontinuous along the length of the column to form two independent subcolumns, each subcolumn can include a cell network 18 incorporating both a storage network 22 and a logic network 24. With such an arrangement, a single column can represent two or more independent variables.

The logic networks 24 connect the conductors of the columns and the rows to one another in a manner which enables the logical conjunctive and disjunctive functions, i.e., NAND and NOR, to be performed. More specifically, the output conductors of a column can be connected to a row conductor to perform the conjunctive function, so that a row conductor will be energized to indicate a particular state when all the variables represented by the connected columns are at the proper respective logic levels. Likewise, the row conductors can be connected to the column input conductors to perform the logical disjunctive function, so that a column input conductor will be occupy a predetermined state whenever any one of the row conductors connected to it is energized.

By selectively connecting the column conductors and the row conductors, the array can carry out a number of Boolean functions to execute a predetermined program.

Figure 2:
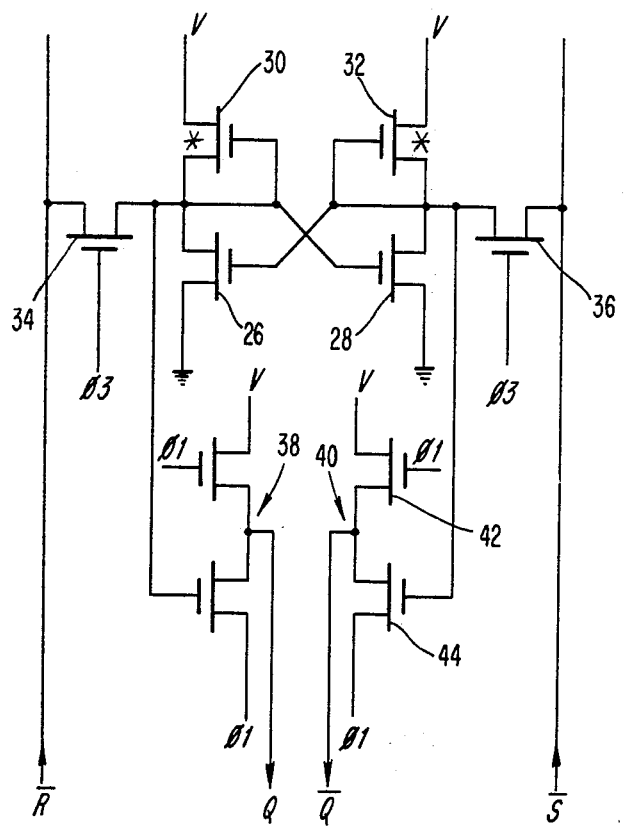
FIG. 2 is a schematic circuit diagram of a first embodiment of a storage network circuit wherein the memory element in the network comprises a bistable flip-flop.

One preferred embodiment of a storage network circuit constructed in accordance with the present invention is illustrated in FIG. 2. The storage network includes a static bistable flip-flop comprised of a pair of interconnected transistors 26, 28. These transistors are preferably of the FET type, and more particularly, metal-oxide-semiconductor field effect transistors (MOSFET's). A power signal is applied from a DC power source V to the flip-flop by means of a pair of depletion, or load, transistors 30, 32 each having its gate electrode connected to its source electrode. The set and reset input signals for the flip-flop are supplied by means of the column input conductors $\overline{S}$ and $\overline{R}$, and are transmitted to the flip-flop by means of a pair of input signal transmitting transistors 34, 36. The source and drain electrodes of the input signal transmitting transistors 34, 36 are connected between the column input conductors $\overline{R}$ and $\overline{S}$ and the input terminals of the flip-flop, i.e., the respective gate electrodes of the flip-flop transistors 26 and 28. The gate electrodes of the input signal transmitting transistors 34, 36 are connected to one output terminal of a three-phase clock (not shown), to be energized during a predetermined portion ∅3 of each cycle in the clock signal and thereby transmit the input signals from the column input conductors to the flip-flop.

The output terminals of the flip-flop, i.e., the drain electrodes of the flip-flop transistors 26, 28, are connected to a pair of column output conductor precharge drivers 38, 40. Each conductor driver includes a power signal transmitting transistor 42 connected between the DC power source V and the respective column output conductor. These transistors are actuated by another phase ∅1 of the output signal from the three-phase clock. Each driver also includes a discharging transistor 44 connected in series with the power signal transmitting transistor 42. The drain electrode of the discharging transistor 44 is connected to the column output conductor and the source electrode of the transistor is connected to the output terminal of the clock at which the ∅1 signal for controlling the power signal transmitting transistor 42 appears. The gate electrode of the discharging transistor is connected to the output terminal of the flip-flop, and the discharging transistor 44 of each driver 38, 40 is thereby controlled in accordance with the information stored in the flip-flop.

Figure 3:
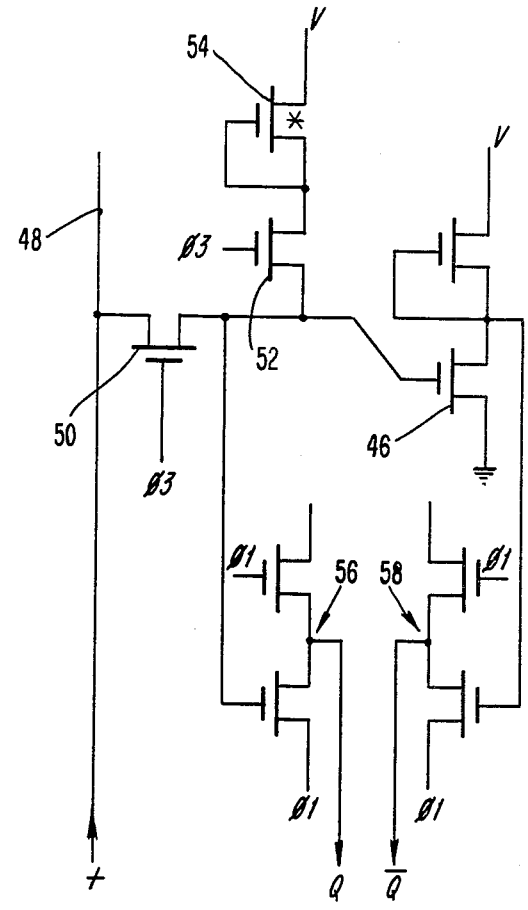
FIG. 3 is a schematic circuit diagram illustrating a second embodiment of a storage network circuit wherein the memory element of the network comprises an inverter.

A second embodiment of a storage network circuit is illustrated in FIG. 3. This network differs from that illustrated in FIG. 2 in that the memory element of the network is a static inverter comprised of a single transistor 46. The storage which is performed in this type of circuit is temporary in nature, in that the state of an input signal is stored, and inverted, for only one clock cycle, rather than permanent, i.e., continuous storage of the input signal until its state changes, as in the flip-flop memory element. The inverter storage network includes only a single column input conductor 48, and therefore only a single input signal transmitting transistor 50. In further contrast to the flip-flop storage network, the inverter storage network includes a power signal transmitting transistor 52 connected between a depletion transistor 54 and the input terminal of the inverter, i.e., the gate electrode of the inverter transistor 46. The power signal transmitting transistor 52 is actuated by the same phase (∅3) of the clock signal as the input signal transmitting transistor 50.

The inverter storage network is similar to the flip-flop storage network in that it includes a pair of column output conductors Q and $\overline{Q}$ and conductor pre-charge drivers 56, 58. The driver 56 for the Q conductor is connected to the input terminal of the inverter and the driver 58 for the $\overline{Q}$ conductor is connected to the output terminal of the inverter, i.e., the drain electrode of the inverter transistor 46.

Figure 4:
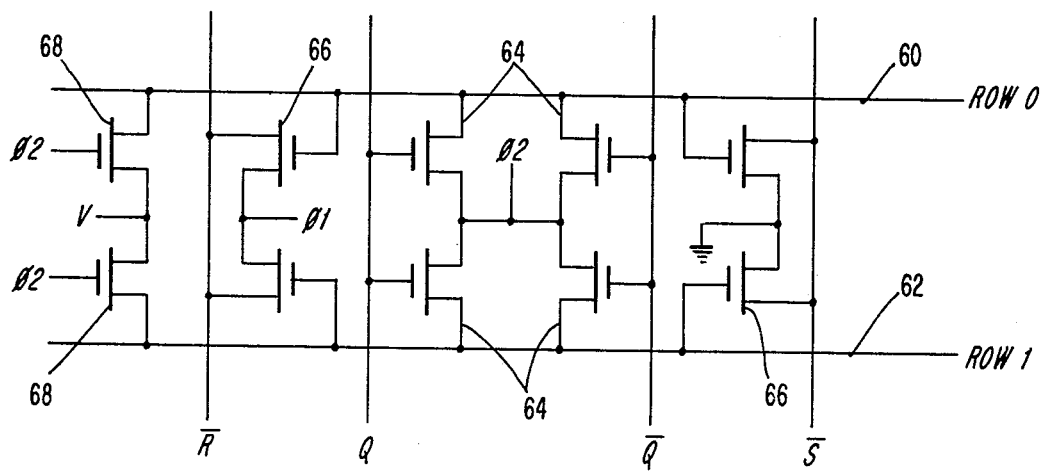
FIG. 4 is a schematic circuit diagram of the preferred embodiment of a logic network circuit constructed in accordance with the present invention.

A logic network circuit, or row cell, is illustrated in FIG. 4. Each row cell includes a pair of row conductors 60, 62 forming two adjacent rows in the structured logic array. In addition, each cell includes four column conductors $\overline{R}$, Q, $\overline{Q}$ and $\overline{S}$ to enable the row cell to be operatively connected with a storage network. It will be apparent that only the two column output conductors Q and $\overline{Q}$ and one of the column input conductors R or $\overline{S}$ are utilized when the row cell is associated with an inverter storage network, with the other column input conductor of the row cell being left unconnected.

The column and row conductors of the row cell are interconnected by means of transistors to perform logical functions. The column output conductors Q and $\overline{Q}$ are connected to the row conductors by means of conjunctive transistors 64 each having a gate electrode connected to a column output conductor, one of its source and drain electrodes connected to one of the row conductors, and the other of its source and drain electrodes responsive to another phase ∅2 of the output signal from the three-phase clock. Transistors connected in this manner perform the logical conjunctive (NAND) function whereby each column output conductor connected to a row conductor by means of such a transistor must be in the binary low state for the row conductor to be energized and thereby indicate the binary high state.

A column input conductor $\overline{R}$ or $\overline{S}$ is connected to a row conductor in the row cell by means of a disjunctive transistor 66 having its gate electrode connected to the row conductor, one of its source and drain electrodes connected to the column input conductor, and the other of its source and drain electrodes either responsive to the ∅1 portion of the three-phase clock signal or connected to a ground potential. Transistors connected in this manner perform the logical disjunctive (NOR) function, wherein energization of any row connected to a column input conductor by a disjunctive transistor will cause the column input conductor to occupy the binary low state.

It will be appreciated that the illustration of a row cell depicted in FIG. 5 is a general representation illustrating all of the logical functions 1, 0, R and S which can be performed with each row in the cell. In practice, however, only selected ones of the conjunctive and disjunctive transistors 64 and 66 would be connected to any one row conductor, since it would not be logically feasible to have a single row conductor responsive to two complementary states.

In addition to the logically interconnecting transistors 64, 66, each row conductor of the row cell can have a precharge transistor 68 connected thereto. The drain to source current path of the precharge transistor 68 operatively connects the row connector to the DC power source V when the transistor is conducting. The gate electrode of the precharge transistor is responsive to the ∅2 portion of the three-phase clock signal so that each row conductor is brought to the potential of the power source for the duration of the ∅2 output pulse in each cycle of the clock signal.

The previously described flip-flop and inverter storage network circuits and the logic or row cells can be electrically connected to one another to form a structured logic array. For example, the various networks can be connected, as illustrated in FIG. 5, to form a structured logic array having five columns C0-C4 and eight rows R0-R7. In view of the fact that the column input and output conductors of each of the storage and logic networks are vertically disposed within the network arrangement, it is not necessary to arrange all of the storage networks at the top of the array, as was required in prior art circuits utilizing horizontally disposed input and output conductors. Rather, the storage network can be physically located at any desired position along the length of a column, thereby providing versatility in the design and arrangement of the structured logic array. This design versatility becomes particularly significant when the structured logic array is incorporated in an integrated circuit.

It will be noted that not every column in the structured logic array must include a storage element, as illustrated with respect to column C3 in FIG. 5. Likewise, a column can include more than one storage element if the column is segmented to form two or more subcolumns. Referring to FIG. 5, column C4 is segmented between rows R2 and R3 (illustrated by the parenthetical symbols), and includes both flip-flop and inverter storage networks.

One example of a three-phase clock signal which can be utilized to provide control signals to the transistors of the storage and logic network circuits is illustrated in FIG. 6. The leading edges of the ∅1 and ∅2 clock pulses occur at the same time. The ∅2 clock pulse has a longer duration than the ∅1 pulse and therefore terminates subsequent to the ∅1 pulse. The leading edge of the ∅3 clock pulse occurs after the termination of both of the ∅1 and ∅2 clock pulses, and the falling edge of the ∅3 clock pulse occurs at approximately the same time as the leading edge of the ∅1 and the ∅2 clock pulses in the next cycle of the clock signal.

In an exemplary embodiment of the invention, the clock pulses can each have an amplitude of about five volts and one clock cycle can occupy approximately 650 nsec. In another example, the clock pulses may each have an amplitude of about ten volts and the clock cycle need only be approximately 500 nsec long, due to the shorter amount of time necessary to pre-charge the column and row conductors with the increased voltage signal.

The operation of the previously described storage and logic networks will now be described with reference to exemplary embodiments of structured logic arrays incorporating such networks. Referring to FIG. 7, a structured logic array including a flip-flop storage network 70, an inverter storage network 72, and two row cells 74, 76 is illustrated. The structured logic array is designed to execute the program illustrated in FIG. 7a. Specifically, a pair of conjunctive transistors 78, 80 and a pair of disjunctive transistors 82, 84 interconnect the column conductors of the flip-flop storage network 70 and the row conductors to alternately set and reset, or toggle, the flip-flop in the storage network 70, i.e., the flip-flop will be reset when its output signal is in the binary high state and will be set when its output signal is in the binary low state. A disjunctive transistor 86 in the row cell 76 connects the inverter storage network 72 to the first row conductor R0 so that the inverter will produce an inverted (low) output signal whenever the output signal of the flip-flop is in the binary high state.

At the inititation of operation of the structured logic array illustrated in FIG. 7, the flip-flop storage network 70 is in the reset state wherein transistor 26 is off and transistor 28 is on, and all of the clock signals are initially in the low state, i.e., at ground potential. The ∅1 and ∅2 clock signals go high simultaneously to carry out the precharging operation. The precharging of the column output conductors Q and $\overline{Q}$ is accomplished when the power signal transmitting transistors 42 of the column precharge drivers 38, 40 are rendered conductive by the ∅1 clock pulse to thereby connect the column output conductors to the source of DC power V and charge a pair of capacitors 86, 88 respectively associated with the output conductors.

In the preferred embodiment of the invention, the structured logic array is constructed as an integrated circuit, most preferably an MOS circuit, and the stray capacitance which is inherent to such a circuit forms the capacitors 86, 88 associated with the column conductors. During the precharging operation, the source electrode of each of the discharging transistors 44, 45 in the column precharge drivers 38, 40 is held at a high potential by the ∅1 clock pulse, and therefore the signals at their respective gate electrodes will not have any effect upon the precharging of the column conductors.

In a similar manner, the precharge transistors 68 of the row cell 74 connect the row conductors R0 and R1 to the power source V for the duration of the ∅2 clock pulse to thereby charge the capacitors 90, 92 associated with the row conductors. As noted previously, these capacitors are preferably the stray capacitance associated with the row conductors when the structured logic array is constructed as an integrated circuit. Since the source electrodes of the conjunctive transistors 78 and 80 of the row cell 74 are connected to the ∅2 terminal of the three-phase clock, these transistors will not be rendered conductive for the duration of the ∅2 clock pulse and will thereby enable the row conductors to be precharged.

After the column and row conductors have been precharged, the ∅1 clock pulse will return to ground potential and the data stored in the flip-flop will be transmitted to the column output conductors. Thus, since the transistor 26 of the flip-flop is off, the gate electrode of the transistor 44 in the column precharge driver 38 will be in a high state, rendering the transistor conductive when the ∅1 signal returns to ground potential, thereby discharging the capacitor 86 associated with the column output conductor Q. However, since the transistor 28 in the flip-flop is on, the gate electrode of the transistor 45 in the column percharge driver 40 will be at ground potential, thereby rendering the transistor 45 non-conducting to maintain the capacitor 88 charged. Thus, the column output conductor Q will be in a low state and the column output conductor $\overline{Q}$ will be a high state, representing the reset state of the flip-flop.

When the ∅2 signal returns to ground potential, the row conductors will take on the binary states determined by the states of the column conductors connected thereto by the conjunctive transistors in the row cells. Thus, since the $\overline{Q}$ column output conductor is charged, the conjunctive transistor 80 connected to row R1 will be rendered conductive when the ∅2 signal returns to ground, thereby discharging the capacitor 92 associated with that row conductor. However, since the only conjunctive transistor connected to row R0 has its gate electrode connected to the Q column output conductor of the flip-flop storage network 70, which is in a low state, the transistor will not be rendered conductive and will not provide a discharge path for the capacitor 90, thereby causing the row R0 to remain in the charged state. This state is logically equivalent to the binary 1 state.

The charged state of row R0 will render the disjunctive transistor 82 in the row cell 74 conductive. The conductive transistor will provide a current path through the input signal transmitting transistor 34 when ∅3 clock signal goes to a high state. This will cause the gate electrode of the flip-flop transistor 28 to go to ground potential, thereby changing the state of the flip-flop from the reset state to the set state.

A similar process is repeated on the next clock cycle, except that the set, or binary 1, state of the flip-flop is detected and the flip-flop is reset. Thus, the flip-flop is toggled to change the state of its output signal during each clock cycle.

The operation of the inverter storage network 72 is similar to that of the flip-flop storage network. Thus, when the flip-flop is in its reset state, thus placing the row R0 in the binary 1 state, the disjunctive transistor 86 of the row cell 76 is rendered conductive, thereby pulling the input terminal of the inverter, i.e., the gate electrode of the inverter transistor 46, to ground when the $\emptyset 3$ clock signal goes high to render the input signal transmitting transistor 50 conductive. When the $\emptyset 3$ signal returns to the ground potential, the low signal transmitted to the inverter will be stored on the gate electrode of the inverter transistor 46 since both of the signal transmitting transistors 50 and 52 of the storage network 72 are off. The signal stored in the inverter is then rebuffered by the transistors of the column precharge drivers 56 and 58 to place the Q column output conductor in a high state and to discharge the $\overline{Q}$ column output conductor when the $\emptyset 1$ clock signal goes through its cycle. Thus, the Q column output conductor of the inverter storage element 72 produces a high signal indicating that the flip-flop of the storage element 70 is in its reset state, i.e., the $\overline{Q}$ column output conductor of the flip-flop storage network is low.

Alternately, if row R0 goes low after the $\emptyset 2$ clock signal returns to ground, the disjunctive transistor 86 would not turn on. Thus, the input signal to the inverter transistor 46 would remain high, causing the opposite signal to be produced by the inverter storage network 72.

From the foregoing description of the operation of the structured logic array constructed in accordance with the present invention, it will be apparent that the columns and rows of the array operate in a dynamic fashion to update or renew the information represented by each conductor in the array during each clock cycle. The charging operation takes place very rapidly, thereby rendering the circuit suitable for use in those applications requiring high-speed switching. Furthermore, this dynamic mode of operation achieves power savings, since power is supplied to the various conductors forming the columns and rows only during a small portion of each clock cycle.

Figure 8:
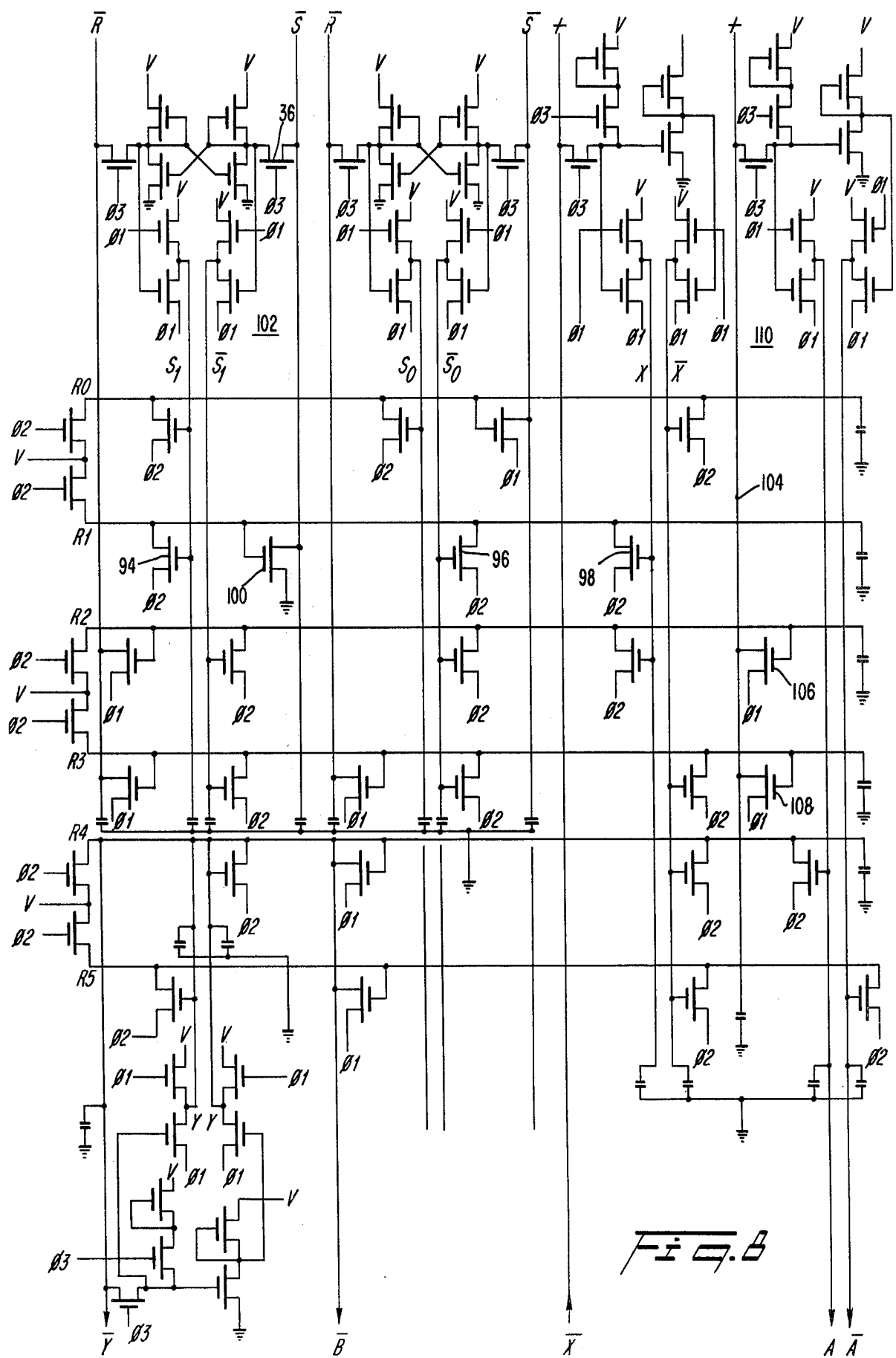
FIG. 8 is a schematic circuit diagram of a more complex structured logic array.

As a further example of the applications of the present invention, a segmented structured logic array for executing a more complex program is illustrated in FIG. 8. The state diagram for a portion of the program is illustrated in FIG. 8a. $S_0$ and $S_1$ are internal variables of the program and the three states J, K and L are defined as follows:

$$J = \overline{S_1} \overline{S_0}$$

$$K = \overline{S_1} S_0$$

$$L = S_1 S_0$$

The binary state of the input variable X determines the transistions from one state to another illustrated in FIG. 8a, and the output variable A goes high whenever the program is in state L, i.e., $A = L = S_1 S_0$.

The structured logic array realization of the state diagram is set forth in the first four rows R0-R4 of the implementation diagram of FIG. 8b. In addition to the variables defined above, the program to be implemented by the structured logic array includes an additional input variable Y and an additional output variable B wherein:

$$B = \overline{A} XY + AX\overline{Y}.$$

The two possible states in which the output variable B is high are represented in the last two rows of the implementation diagram of FIG. 8b. Since the internal input variables $S_0$ and $S_1$ are independent of the input variable Y and output variable B, these two pairs of variables can be represented in the same two columns of the structured logic array by segmenting the columns, as illustrated in the diagram of FIG. 8b by the parenthetical symbols between rows R3 and R4 of the first two columns. Thus, referring to the structured logic array circuit illustrated in FIG. 8, the first eight column conductors, representing the first two columns of the array, are not continuous throughout the length of the columns, but rather are broken between rows R3 and R4, to enable the internal variables $S_0$ and $S_1$ to be represented by the first four rows in the first two columns and the input variable Y and the output variable B to be represented by the last two rows in the first two columns of the array.

The operation of the structured logic array illustrated in FIG. 8 is similar to the operation described with respect to the circuit illustrated in FIG. 7, wherein each of the row conductors and the column output conductors are precharged when the $\emptyset 1$ and $\emptyset 2$ clock signals go high. When the $\emptyset 1$ clock signal goes low, the column output conductors will be discharged or remain charged in accordance with the information stored in the respective storage networks associated with the columns. Likewise, when the $\emptyset 2$ clock signal goes low, the row conductors will either remain charged or be discharged in accordance with the state of conductivity of the conjunctive transistors attached to the respective rows. Information relating to the binary state of each row will be transmitted to the column input conductors by means of the disjunctive transistors connected to the row conductors when the $\emptyset 2$ clock signal goes low. Subsequently, when the $\emptyset 3$ clock signal goes high, the information represented by the states of the column input conductors will be transmitted to the respective memory elements of the columns.

Thus, for example, when the internal variables $S_1$ and $S_0$ are in the states 0 and 1, respectively, indicating that the program is in state K, and the input variable X is 0, indicating that a transition from state K to state L is to take place, all of the conjunctive transistors 94, 96, 98 connected to the row conductor R1 will be off, thereby causing the row conductor R1 to remain in the high state when the $\emptyset 2$ clock signal goes low. The disjunctive transistor 100 connected to the row R1 conductor will be turned on by the high state of the row conductor, thereby providing a current path to ground when the input signal transmitting transistor 36 of the first storage element is turned on in response to the $\emptyset 3$ clock signal. This path to ground will cause the flip-flop of the storage network 102 to be set, thereby changing the state of the internal variable $S_1$ from 0 to 1 when the $\emptyset 1$ clock signal returns to ground on the next subsequent clock cycle. Thus, a transition from state K to state L will have taken place.

When the program is in state L, one of the row conductors R2 or R3 will be in a high state, depending on whether the input variable X is 0 or 1, respectively. Since the column input conductor 104 of the last column is connected to both of these row conductors by a pair of disjunctive transistors 106, 108, the input conductor 104 will be in a low state when the $\emptyset 1$ clock signal returns to ground potential when the program is in state L. This information will be transmitted to the inverter in the storage network 110 for the last column during the high portion of the θ3 clock signal, causing the column output conductor representing the output variable A to go high, thereby indicating that the program is in the L state.

The remaining storage networks, column conductors and row conductors of the structured logic array illustrated in FIG. 8 operate in a similar manner to execute the program represented by the implementation diagram of FIG. 8b.

As discussed previously, a structured logic array constructed in accordance with the present invention is particularly adapted to be embodied in an integrated circuit. One design for an inverter type storage network using MOS integrated circuit technology is represented by the composite layout. Illustrated in FIG. 9, along with a legend indicating the symbols which are used to identify the various layers and materials which comprise the integrated circuit. Within the illustrated circuit, a transistor is formed wherever a polysilicon layer and a diffusion layer intersect. A contact hole indicates a point at which electrical contact is made between a semiconductor layer and a data conductor. The depletion mask symbol indicates the location of the load transistors which are connected to the power source and transmit the power to the inverter circuit. As noted previously, the stray capacitance inherent to such a circuit can form the capacitors associated with the various column and row conductors.

The data conductors for the three clock signals, the power signal V and the ground reference potential extend to the edges of the substrate upon which the integrated circuit is constructed, since every network circuit receives these signals. However, the conductors for the input and output signals $\overline{R}$, $\overline{S}$, Q and $\overline{Q}$ do not extend to the edges of the substrate. This arrangement of the conductors enables these input and output conductors to be selectively connected to adjacent network circuits in accordance with the design of the structured logic array in which they are incorporated. Thus, the $\overline{R}$ input conductor can be left unconnected since the inverter storage element requires only one input conductor. By arranging the data conductors along the edge of the substrate in a similar manner for each network circuit, the various circuits can be readily electrically connected with adajcent integrated circuits to fabricate a structured logic array.

The present invention may be embodied in other specific forms without departing from the spirit or essential characteristics thereof. For example, it will be appreciated that the disjunctive transistors of a row cell can be connected to the ∅2 clock signal, rather than the ∅1 clock signal as illustrated in the previously described preferred embodiments, and still operate in the same manner to transmit information, relating to the state of a row conductor, to a column input conductor. Furthermore, although the preferred embodiment has been described in connection with MOS integrated circuit technology, it is equally applicable to other technologies, such as Static Induction Transistors and MESFETS, for example. Other such modifications will be readily apparent to those of ordinary skill in the art.

The presently disclosed embodiments are therefore considered in all respects as illustrative and not restrictive. The scope of the invention is indicated by the appended claims rather than the foregoing description, and all changes which come within the meaning and range of equivalency of the claims are therefore intended to be embraced therein.

What is claimed is:

1. A structured logic array comprising a plurality of logical columns, each having at least one column input conductor and at least one column output conductor, and a plurality of row conductors disposed orthogonal to said column conductors, said logic array including:
    means for generating at least two phase-displaced clocking signals;
    a storage cell operatively associated with one of said logical columns and having a memory element, means for precharging the output conductor of the associated column to a predetermined value during a first one of said clocking signals and for causing said output conductor to assume a binary state determined by information stored in the memory element upon the termination of said first clocking signal, and means responsive to a second one of said clocking signals for opertively transmitting the information on the column input conductor to said memory element; and
    a logic cell for interconnecting the logical columns and the row conductors and having means for precharging the row conductors during the first clocking signal, means for controlling the binary state of a row conductor upon termination of said first clocking signal, and means for transmitting the binary state of the row conductor to at least one column input conductor.

2. The structured logic array of claim 1 wherein said logic cell transmitting means is also responsive to said first clocking signal.

3. The structured logic array of claim 1 wherein said first clocking signal includes a first clock pulse of predetermined duration and a second clock pulse overlapping said first clock pulse and terminating subsequent to said first clock pulse, further wherein said output conductor precharging means is responsive to said first clock pulse.

4. The structured logic array of claim 3 wherein said logic cell transmitting means is also responsive to said first clock pulse.

5. The structured logic array of claim 1 wherein said storage cell memory element is a flip-flop.

6. The structured logic array of claim 1 wherein said storage cell memory element is an inverter.

7. The structured logic array of claim 1 wherein said output conductor precharging means includes a capacitor associated with said output conductor, a first transistor for connecting said output conductor to a voltage source during said first clocking signal to charge said capacitor, and a second transistor responsive to a signal at an output terminal of said memory element for discharging said capacitor.

8. The structured logic array of claim 7 wherein said first and second transistors are connected in series and said output conductor is connected to their common junction.

9. The structured logic array of claim 8 wherein said second transistor is a field effect transistor, the gate electrode of said transistor is connected to an output terminal of said memory element, one of the drain and source electrodes of said transistor is connected to said common junction, and the other of the drain and source electrodes is connected to the means for generating the first clocking signal.

10. The structured logic array of claim 1 wherein each row conductor has a capacitor associated therewith and said row conductor precharging means includes a transistor responsive to said first clocking signal to connect a row conductor to a voltage source to charge the associated capacitor.

11. The structured logic array of claim 10 wherein said row conductor controlling means includes a transistor responsive to the signal on a column output conductor for discharging the capacitor.

12. The structured logic array of claim 11 wherein the transistor of said row conductor controlling means is a field effect transistor, the gate electrode of said transistor is connected to the column output conductor, one of the drain and source electrodes of said transistor is connected to the row conductor, and the other of said drain and source electrodes is connected to the means for generating the firs clocking signal.

13. The structured logic array of claim 11 wherein said transmitting means is a field effect transistor, the gate electrode of said transistor is connected to the row conductor and one of the source and drain electrodes of the transistor is connected to a column input conductor.

14. The structured logic array of claim 13 wherein the other of the source and drain electrodes of said transistor is connected to said means for generating the first clocking signal.

15. The structured logic array of claim 7 or 10 wherein said storage cell and said logic cell are incorporated in an integrated circuit and wherein said capacitor is a parasitic capacitance inherent to such an integrated circuit.

16. In a structured logic array having a plurality of input and output column conductors and a plurality of row conductors logically interconnecting the column conductors in accordance with a predetermined function, a method of dynamically producing a predetermined output signal in response to a predetermined input signal, comprising the steps of:
storing the signals on the column input conductors in memory elements associated with the respective columns;
precharging the column output conductors to a predetermined level;
precharging the row conductors to a predetermined level;
selectively discharging the column output conductors in accordance with signals stored in their associated memory elements;
selectively discharging the row conductors, responsive to the charged and discharged column output conductors, in accordance with the predetermined function; and
selectively transferring the information represented by the charged and discharged row conductors to the column input conductors, in accordance with the predetermined function.

17. The method of claim 16 wherein the steps of precharging the column output conductors and precharging the row conductors occur simultaneously.

18. The method of claim 17 wherein the step of selectively discharging the column output conductors occurs prior to the step of selectively discharging the row conductors.

19. A storage cell for use in a structured logic array having a plurality of logical columns and a plurality of row conductors interconnecting the columns to perform at least one predetermined Boolean function, said storage cell comprising:
at least one column input conductor and at least one column output conductor;
a memory element;
means for precharging said output conductor to a predetermined voltage value;
means for selectively discharging said output conductor responsive to the information stored in the memory element; and
means for transmitting a signal on said input conductor to said memory element during a first predetermined time period.

20. The storage cell of claim 19 wherein said memory element is a flip-flop.

21. The storage cell of claim 19 wherein said memory element is an inverter.

22. The storage cell of claim 19 wherein said precharging means includes a capacitor associated with said output conductor and a transistor for connecting said output conductor to a voltage source to charge said capacitor during a second predetermined time period.

23. The storage cell of claim 22 wherein said selective discharging means includes a transistor responsive to the information stored in the memory unit to connect said output conductor to a ground potential upon the termination of said second time period, to thereby discharge said capacitor.

24. The storage of claim 23 wherein said cell is incorporated in an MOS integrated circuit and said capacitor is a parasitic capacitance inherent to such an integrated circuit.

25. A logic cell for use in a structured logic array to logically interconnect column and row conductors in accordance with a predetermined Boolean function, said cell comprising:
at least one row conductor;
at least one column input conductor and at least one column output conductor;
means for precharging said row conductor to a predetermined voltage value;
means for discharging said row conductor in response to a signal on said output conductor; and
means for transmitting information relating to the state of the row conductor to said input conductor.

26. The logic cell of claim 25 wherein said precharging means includes a capacitor associated with said row conductor and a transistor for connecting said row conductor to a voltage source to charge said capacitor during a predetermined time period.

27. The logic cell of claim 26 wherein said cell is incorporated in an MOS integrated circuit and said capacitor is a parasitic capacitance inherent to such an integrated circuit.

28. The logic cell of claim 25 including a plurality of column output conductors and wherein said discharging means is selectively responsive to the signals on said output conductors in accordance with the Boolean function.

29. The logic cell of claim 27 further including a plurality of row conductors and wherein said discharging means selectively discharges said row conductors in accordance with the Boolean function.

* * * * *